United States Patent [19]

Eccleston

[11] Patent Number: 4,859,936
[45] Date of Patent: Aug. 22, 1989

[54] METHOD OF AND APPARATUS FOR DETERMINING AC CALIBRATION ERRORS AND APPARATUS USING DEVICE WITH AC CALIBRATION ERRORS

[75] Inventor: Larry E. Eccleston, Edmonds, Wash.

[73] Assignee: John Fluke Mfg. Co., Inc., Everett, Wash.

[21] Appl. No.: 51,318

[22] Filed: May 19, 1987

Related U.S. Application Data

[63] Continuation-in-part of Ser. No. 8,234, Jan. 29, 1987.

[51] Int. Cl.$^4$ .................. G01R 35/00; G01R 1/02
[52] U.S. Cl. .................... 324/130; 324/74; 324/73 AT; 324/73 R
[58] Field of Search .................. 324/130, 74, 76, 115, 324/73 AT; 364/571, 573

[56] References Cited

U.S. PATENT DOCUMENTS

| | | | |
|---|---|---|---|
| 3,012,197 | 12/1961 | Peterson et al. | 324/130 |
| 3,105,239 | 9/1963 | McIntyre | 324/130 |
| 4,200,933 | 4/1980 | Nickel et al. | 324/130 X |
| 4,337,517 | 6/1982 | Nickel et al. | 324/130 X |
| 4,633,173 | 12/1986 | Kashiwagi | 324/130 X |
| 4,663,586 | 5/1987 | Swerlein et al. | 324/130 X |
| 4,739,495 | 4/1988 | Levine | 364/571 X |

FOREIGN PATENT DOCUMENTS 0708251  1/1980  U.S.S.R. .............................. 324/130

Primary Examiner—Reinhard J. Eisenzopf
Assistant Examiner—Vinh P. Nguyen
Attorney, Agent, or Firm—Mikio Ishimaru; Stephen Becker

[57] ABSTRACT

Calibrating errors of a variable gain amplifier used in an AC calibrator or a meter for measuring AC is determined for a gamut of frequencies. The gain of the variable gain amplifier is varied by adjusting the value of a variable resistor in discrete steps. A variable amplitude signal is applied to the amplifier while the resistor is adjusted in discrete steps so the amplifier derives a gamut of variable amplitude signals that are supposed to have predetermined values. The amplitudes of the gamut of variable amplitude signals derived by the amplifier are detected and compared with the values that the signals are supposed to have to derive a calibrating error signal of the amplifier for each variable resistor value. A gamut of variable frequency, constant amplitude signals is applied to the amplifier while the amplifier gain is constant. The amplifier has a tendency to derive an AC output signal having a different amplitude in response to different ones of the frequencies. The amplitude of the amplifier output for each frequency in the gamut of frequencies applied to the amplifier is detected and compared with the output signal of the amplifier while each frequency in the gamut of frequencies is applied to the amplifier with the amplitude of the amplifier output for one frequency in the gamut to derive an amplitude versus frequency response indication of the amplifier. The amplitude versus frequency response indication is modified by the derived calibrating error signal. The calibrated amplifier is used in a voltmeter or AC calibrator to that the amplifier output is modified as a function of input frequency and gain setting.

6 Claims, 3 Drawing Sheets

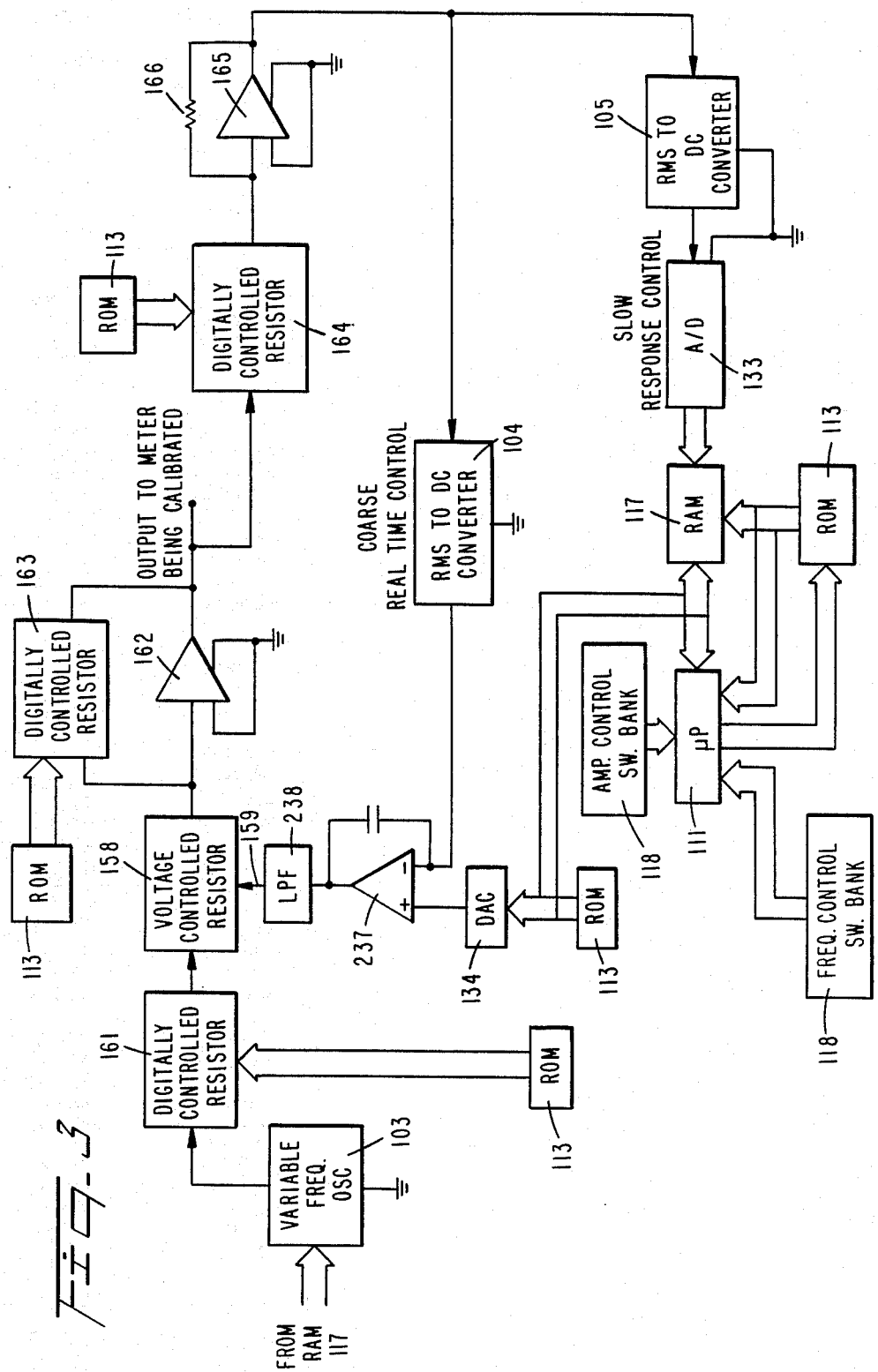

of and apparatus for determining the magnitude of errors introduced as a function of frequency by a circuit used in a device to derive a calibrating AC output signal or a device for measuring the amplitude of an AC signal and apparatus including the circuit in which the errors have been determined.

METHOD OF AND APPARATUS FOR DETERMINING AC CALIBRATION ERRORS AND APPARATUS USING DEVICE WITH AC CALIBRATION ERRORS

RELATED APPLICATION

The present application is a continuation-in-part of my co-pending, commonly assigned application entitled "Apparatus For and Method of Internally Calibrating an Electrical Calibrator", Ser. No. 008,234, filed Jan. 29, 1987.

TECHNICAL FIELD

The present invention relates generally to a method of and apparatus for determining the magnitude of errors introduced as a function of frequency by a circuit used in a device to derive a calibrating AC output signal or a device for measuring the amplitude of an AC signal and apparatus including the circuit in which the errors have been determined.

BACKGROUND ART

It is necessary, for certain types of equipment, to determine the magnitude of errors introduced as a function of frequency by a circuit employed in that equipment. The circuit is also usually employed over a several amplitude ranges. For example, calibrators for deriving AC calibrating voltages that are applied to AC voltmeters to be calibrated include variable gain amplifiers responsive to a variable frequency AC source. The gain of the amplifier is varied as a function of the range of the AC output signal of the calibrator, while the frequency of the oscillator is varied as a function of the desired output frequency of the calibrator. In the calibrator specifically disclosed in the co-pending application, the amplitude and frequency ranges are respectively between 200 millivolts and 1,100 volts and 10 Hz and 1 MHz.

AC voltmeters incorporate similar variable gain amplifiers designed to be responsive to AC voltages, over wide amplitude and frequency ranges, e.g., between 200 millivolts and 1,100 volts and frequencies between 10 Hz and 1 MHz. Amplifiers employed in AC meters must be capable of scaling the AC voltage applied to input terminals of the meter to a level which can be handled by a precise AC-to-DC detector connected to output terminals of the amplifier. The detector is usually capable of accurately handling voltages only over a relatively narrow range of AC output voltages of the amplifier, for example, 0 to 20 volts. Hence, the amplifier must be capable of providing gain and attenuation of the AC input signal over a wide range of input amplitudes and frequencies.

The variable gain amplifiers employed in calibrators and AC voltmeters employ, as the gain determining elements thereof, resistors which are variable in discrete steps, as a function of the range of the voltage to be handled by the amplifier. The resistors of different amplifiers have different values and are subject to change in values as a function of time, temperature and other environmental factors. The different values of the resistors change the gain of the amplifiers with which they are associated so the output voltages of the amplifiers for a particular amplitude differs from what it is supposed to be. Changing the amplitude of the output voltages of the variable gain amplifiers employed in calibrators and voltmeters thereby causes errors in the amplitude of the calibrating voltage applied by the calibrator to a meter being calibrated and the output reading of the meter.

Amplifiers employed in calibrators and meters for ranging, i.e., scaling, also have variable amplitude versus frequency responses. Each amplifier includes distributed reactances, usually in the form of shunt capacitors tending to make the amplifier output voltage decrease as a function of increasing frequency. To enable accurate AC outputs to be derived by calibrators and accurate readings to be obtained from AC voltmeters, it is necessary to determine the amplitude versus frequency response of the amplifiers and other circuits included in the calibrator and voltmeters.

Numerous switches and complex manual procedures, which are time consuming and subject to error, have been previously used to determine the calibrating errors for different ranges and frequencies of circuits employed in AC calibrators and AC voltmeters. The requirement for numerous switches has introduced errors in the calibration process due to the voltage drops associated with the switches.

It is, accordingly, an object of the present invention to provide a new and improved method of and apparatus for determining calibrating errors of a circuit used in an AC calibrator or an AC voltmeter.

Another object of the invention is to provide a new and improved method of and apparatus for more accurately and more easily determining calibration errors of circuits employed in AC calibrators or AC voltmeters over several AC voltage and frequency ranges.

Another object of the invention is to provide a new and improved meter for providing accurage indications of AC voltage over a wide range of amplitudes and frequencies and calibration errors are compensated in a meter scaling circuit as a function of the meter range setting and frequency of the AC voltage applied to the scaling circuit.

DISCLOSURE OF INVENTION

In accordance with one aspect of the invention, the magnitude of errors introduced as a function of frequency by a circuit used in a device to derive a calibrating AC output signal or a device for measuring the amplitude of an AC signal is determined with a precise sensor for deriving a DC output having an amplitude commensurate with the RMS amplitude of an input thereof. Different known DC levels are applied to an input of the circuit while the sensor is connected to be responsive to an output of the circuit. The values of the DC levels and of variable elements in the circuit are controlled so the circuit supplies the sensor with a first gamut of DC signals. Each signal in the first gamut results in the sensor deriving a second gamut of DC signals. The known DC levels and the values of the variable elements are arranged so each signal in the first gamut is supposed to have a predetermined value that is in the range of values that can be handled by the sensor. Actual values of the signals in the second gamut are compared with the value each signal in the second gamut is supposed to have to derive a numerical indication of the DC calibration error for each of the values of the DC levels and of the variable elements.

A constant amplitude AC source is applied to the input of the circuit at each frequency in a gamut of frequencies while the sensor is connected to be responsive to the output of the circuit. One of the frequencies is a frequency at which reactive components in the circuit have a negligible effect on the amplitude of the circuit output. The amplitudes of the sensor output for all of the frequencies in the gamut are compared with the sensor output at the one frequency to derive a numerical indication of the AC calibration error for the constant amplitude at each of the frequencies in the gamut of frequencies. A known calibration error of the precise sensor is combined with the DC calibration errors and the AC calibration errors to derive a calibration error of the circuit for each of several amplitude positions at each of several frequency positions of the AC input. The circuit calibration errors enable the AC output to be more precisely determined or the AC signal to be more precisely measured.

In accordance with a further aspect of the invention, the magnitude of errors introduced as a function of frequency by a circuit used in a device to derive a calibration AC output signal or a device for measuring the amplitude of an AC signal is determined with an apparatus including a precise sensor for deriving a DC output having an amplitude commensurate with the RMS amplitude of an input thereof. An AC source is applied to the input of the circuit at each frequency in a gamut of frequencies while the sensor is connected to be responsive to the output of the circuit. One of the frequencies is a predetermined frequency at which reactive components in the circuit have negligible effect on the amplitude of the output of the circuit. The amplitude of the sensor output is compared for all of the frequencies in the gamut with the output of the sensor at the predetermined frequency to derive a numerical indication of the AC calibration error at each of the frequencies in the gamut of frequencies. An amplitude calibration error for the circuit is derived at each of several amplitude positions in a gamut of input amplitudes for the circuit. The calibration error of the precise sensor is combined with the amplitude calibration errors and the AC calibration errors to derive a calibration error of the circuit for each of several amplitude positions at each of several frequency positions. The circuit calibration errors enable a more precise AC output to be derived or the AC signal to be more precisely sensed.

In accordance with a further aspect of the invention, calibration errors of an amplifier that is variable to provide different ranges of output amplitudes are determined over a gamut of frequencies. The gain of the variable gain amplifier is varied by adjusting the value of a variable resistor of the amplifier in discrete steps. The amplifier is used in an AC calibrator or a meter for measuring an AC signal amplitude. A gamut of variable amplitude signals is applied to the amplifier while the resistor is adjusted to the discrete step values so the amplifier derives a gamut of variable amplitude signals that are supposed to have predetermined values. The amplitudes of the variable amplitude signals in the gamut derived by the amplifier are detected. The detected amplitudes are compared with the values that the signals are supposed to have to derive a calibrating error signal of the amplifier for each discrete step value of the variable resistor. A gamut of constant amplitude, variable frequency signals is applied to the amplifier while the gain of the amplifier is held constant. The amplifier has a tendency to derive an AC output signal having different amplitudes in response to different frequencies in the gamut of variable frequency signals. The amplitude of the amplitude output for each frequency in the gamut of frequencies applied to the amplifier is detected. The amplitude of the amplifier output signal while each frequency in the gamut of frequencies is applied to the amplifier is compared with the amplifier output amplitude for one frequency in the gamut of frequencies to derive an indication of the amplitude versus frequency response of the amplifier. The indication of the amplitude versus frequency response of the amplifier is modified by the derived calibrating error signal of the amplifier.

In accordance with a further aspect of the invention, a digital meter for measuring the amplitude of AC voltages over several ranges includes a variable gain amplifier connected to be responsive to AC voltages applied to input terminals of the meter. The gain of the amplifier is controlled by resistor means included therein. The resistor means is variable in discrete steps in response to a range input signal for the meter. The gain of the amplifier is different for different frequencies of the AC voltages applied to the input terminals, typically because of parasitic reactances included in the amplifier. A digital signal having a value indicative of an AC output voltage of the amplifier is derived, in the preferred embodiment by an RMS-to-DC converter that drives an analog-to-digital converter. Frequency detector means responsive to the AC voltages applied to the input terminals derives a signal indicative of the frequency of the AC voltage applied to the input terminals. In response to the range input signal and the frequency indicating signal, a digital calibration signal for the amplitude of the amplifier output is derived in the preferred embodiment by a microcomputer. The microcomputer includes means for storing amplitude calibration signals for the output voltage of the amplifier as a function of range settings of the amplifier and the frequency of the AC voltage applied to the amplifier. The digital signal indicative of the AC output voltage of the amplifier is modified by the digital calibration signal to derive a corrected digital signal for the AC voltage applied to the input terminals. Digital indicator means responds to the corrected digital signal to provide a precise visual display of the AC voltage applied to the meter.

The above and still further objects, features and advantages of the present invention will become apparent upon consideration of the following detailed description of several specific embodiments thereof, especially when taken in conjunction with the accompanying drawings.

BRIEF DESCRIPTION OF DRAWINGS

FIG. 3 is a block diagram of an AC calibrator employing a variable gain amplifier settable to a number of amplitude ranges and responsive to a gamut of frequencies, wherein the amplifier output is modified to provide for calibration errors of the amplifier as a function of the range setting thereof and the frequency of the input applied to the amplifier.

BEST MODE FOR CARRYING OUT THE INVENTION

Figure 1:
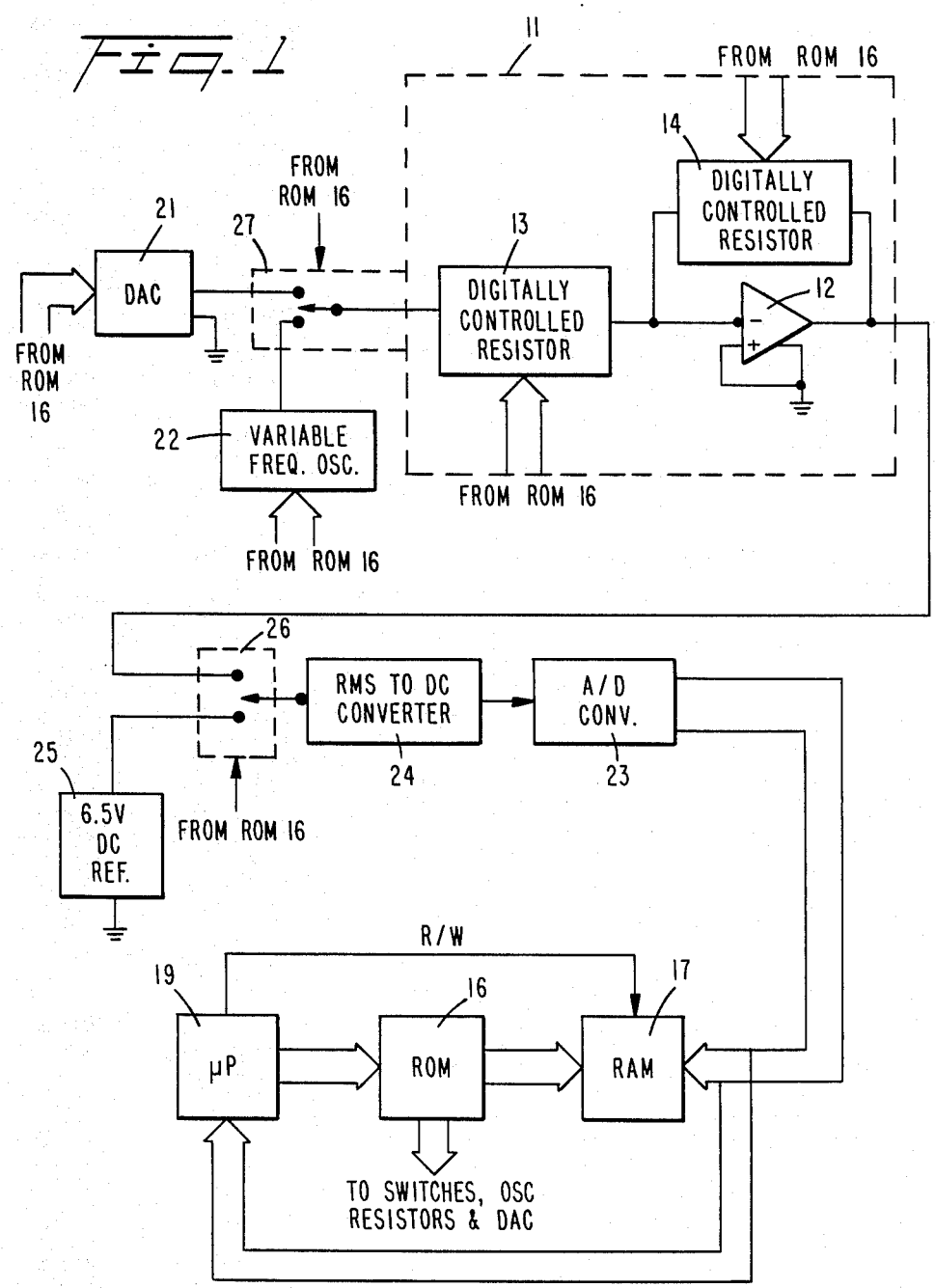
FIG. 1 is a block diagram of an apparatus in accordance with the present invention for determining calibrating errors of an AC amplifier responsive to a gamut of frequencies and designed to produce output voltages in a range of amplitudes.

Reference is now made to FIG. 1 of the drawing wherein there is illustrated an apparatus for conducting a method to determine the calibration errors as a function of amplitude and frequency of circuit 11. Circuit 11 includes operational amplifier 12, digitally controlled input resistor 13 and digitally controlled feedback resistor 14. Resistors 13 and 14, each having a terminal connected to a common node at inverting input terminal 15 of amplifier 12, include multiple, discrete resistors that are selectively connected in circuit in response to digital control signals from read-only memory (ROM) 16. In response to the signals from ROM 16 the values of resistors 13 and 14 are discretely stepwise varied. The values of resistors 13 and 14 control the amplification factor of network 11 on a gross basis. The gain of network 11 can exceed or be less than unity; in one particular embodiment, the gain of circuit 11 can vary in discrete steps from 1/300 to 300.

The resistors 13 and 14 included in different ones of circuits 11 are subject to being different from one circuit to another. In addition, the values of the individual resistors in resistors 13 and 14 are subject to change as a function of temperature, aging and other environmental effects. Resistors 13 and 14, as well as other components in circuit 11, include stray reactances which affect the amplitude of the output of network 11 as a function of the frequency applied to the network. The present invention provides a method of and apparatus for determining the errors in the output amplitude of circuit 11 as a function of frequency of the input applied to the circuit and the settings of resistors 13 and 14. The determined errors in the output of circuit 11, termed calibration errors, are stored in random access memory (RAM) 17 and used to enable the output of circuit 11 to be corrected for the particular use of the circuit in an AC calibrator or an AC voltmeter.

While the calibration errors of circuit 11 can be ascertained manually, through the use of pencil and paper by an operator, it is preferred for the calibration errors to be determined automatically through the use of computer 18, including microprocessor 19, ROM 16 and RAM 17. ROM 16 responds to address input signals supplied to it by microprocessor 19 to derive a program including instructions for connections to circuit 11 and for the values of resistors 13 and 14 to determine the calibration errors. In addition, ROM 16 supplies signals to digital-to-analog converter (DAC) 21 to control the amplitude of a DC output of the converter. ROM 16 also feeds digital signals to variable frequency oscillator 22, to control the oscillator output frequency. RAM 17 responds to a read/write signal from microprocessor 19 and an address signal from ROM 16 to cause the RAM to store calibration error signals derived from analog-to-digital converter 23 and to supply the microprocessor with signals which enable the microprocessor to determine the magnitude of the calibration errors. Microprocessor 19 is also selectively coupled to the data bus RAM 17 to enable the RAM to store the calibration error signals at predetermined addresses therein, under the control of address signals from ROM 16.

Analog-to-digital converter 23 is responsive to DC signals derived from RMS-to-DC converter 24, preferably of the thermal type as included in Fluke Model 8506. Converter 24 is selectively responsive to the output of circuit 11, as derived from the output terminal of amplifier 12, and a 6.5 volt DC reference voltage derived from source 25, preferably Fluke Reference Source Model 732A. The output of circuit 11, which is either AC or DC, and the DC output of reference source 25 are selectively coupled to the input of converter 24 by switch 26. The DC output of DAC 21 and the AC output of constant amplitude, variable frequency oscillator 22 are selectively coupled to an input terminal of resistor 13 by switch 27. The positions of switches 26 and 27 are controlled by outputs of ROM 16.

Initially, the calibration errors of DC reference source 25 and DAC 21 are determined, preferably in the manner described in the previously mentioned co-pending application. The calibration errors for DAC 21 and reference source 25 are stored in designated addresses in RAM 17 under the control of microprocessor 19 and ROM 16.

After the calibration errors for DAC 21 and reference source 25 have been determined, the calibration errors for RMS-to-DC converter 24 and analog-to-digital converter 23 are determined by microprocessor 19 addressing ROM 16 to cause the ROM to (1) command switch 26 to connect the output of reference source 25 to the input of converter 24 and (2) address RAM 17 to the address where the calibration errors for converters 23 and 24 are stored. Under the stated conditions, the output of analog-to-digital converter 23 has a digital value associated with the value stored in RAM 17 for the desired output of reference source 25. In response to signals from microprocessor 19 and ROM 16, the actual output of converter 23 is supplied to a designated address in RAM 17 and compared in the microprocessor with a signal indicative of the output of reference source 25. The resulting digital difference representing signal is stored in a designated address of the RAM and indicates the magnitude of a calibration error of the output of converter 23 relative to the value of 6.5 volt reference source 25, as coupled through converter 24. The resulting calibration error for the output of converter 23 is incremented or decremented by the calibration error for reference source 25 in microprocessor 19. The resulting calibration error is stored in a designated address of RAM 17 and used to modify each subsequent output of converter 23 to provide accurate amplitude and frequency calibration errors for circuit 11.

Next, ROM 16 is commanded by microprocessor 19 to activate switches 26 and 27 so that the DC output of DAC 21 is applied to network 11 and the output of network 11 is fed to the input of RMS-to-DC converter 24. Then DAC 21 is supplied with a series of signals from ROM 16 to command the output of the DAC to step through a series of values. Simultaneously, ROM 16 supplies command signals to resistors 13 and 14 to command the resistors to step through a series of values. The values of the voltage output of DAC 21 and of resistors 13 and 14 are controlled so that circuit 11 derives a voltage having a nominal constant value which can be accurately handled by converter 24 and is equal to the voltage from reference source 25. When circuit 11 is used in a calibrator according to one embodiment, the values of resistors 13 and 14 are varied to cause circuit 11 to derive a range of AC output voltages between 200 millivolts and 1,100 volts in response to a constant amplitude AC input voltage. The calibration error is determined for this application for multiple settings of resistors 13 and 14, such that resistor 14 determines the range settings of the amplifier and resistor 13 determines the in range settings of the amplifier. When circuit 11 is used in one embodiment of an AC meter, the values of resistors 13 and 14 are varied to assist in maintaining the input to a detector in an operating range of 0–20 s even though the input to the meter is in a range of AC input voltages between 200 millivolts and 1,100 volts. It is necessary, therefore, to determine the calibration error of the output of circuit 11 for all combinations and permutations of the values of resistors 13 and 14.

For each of the operating ranges of circuit 11 (in one embodiment, the operating ranges are 200 millivolts full-scale, 2 volts full-scale, 10 volts full-scale, 20 volts full-scale, 200 volts full-scale, and 1,100 volts full-scale), the values of the output of DAC 21 and the values of resistors 13 and 14 are adjusted so that the DC output of circuit 11 is nominally 6.5 volts. The 6.5-volt output of circuit 11 in each range is converted to a digital signal by converter 23 and 24. Each of the resulting outputs of converter 23 is stored in a designated address in RAM 17. Each of the 6.5-volt representing inputs to converter 24 from circuit 11 in each range, as stored in the designated addresses in RAM 17, is compared with the output of converter 23 that subsists when reference source 25 is connected to the input of converter 24, as modified by the calibration errors for DAC 21, reference source 25, and converters 23 and 24. The comparison is performed by a subtraction operation in microprocessor 19 under the control of the program stored in ROM 16. The resulting difference signals are stored in designated addresses in RAM 17 to indicate the calibration error for each range of circuit 11.

After the calibration error for each range has been determined, the calibration errors within each range are determined if the particular circuit 11 is to be used in a calibrator rather than an AC voltmeter. To these ends, ROM 16 responds to microprocessor 19 to energize switches 26 and 27 so that the input to circuit 11 is responsive to the output of DAC 21 and the input of converter 24 is responsive to the output of circuit 11. If circuit 11 is used in a meter, in range determination of calibration errors is not necessary because there is only one setting of circuit 11 for each range of the meter. If circuit 11 is to be used in a calibrator, the output of circuit 11 is coupled to an inverting input of a difference amplifier, having a non-inverting input terminal responsive to the output of a digital-to-analog converter, as described in the co-pending application and discussed infra in connection with FIG. 3. The digital-to-analog converter is sequenced through a series of values to enable the calibration errors for each combination of settings of resistors 13 and 14 to be determined.

The DC calibration errors enable the AC calibration errors to be determined over a wide range of AC amplitudes for the input of circuit 11, without sequencing the values of resistors 13 and 14 through an entire series or gamut of values associated with each frequency of oscillator 22. In essence, the output of circuit 11 is determined for each frequency position of oscillator 22 for a single setting of resistors 13 and 14. From the determined amplitude of the output of circuit 11, the computer system including microprocessor 19, ROM 16 and RAM 17 determines the calibration error for each possible amplitude of the output of circuit 11 for each frequency of oscillator 22. Initially, the output of circuit 11 for a frequency of oscillator 22 where the reactances of circuit 11 have negligible effect is determined; such a frequency (typically 100 Hz) is termed a reference frequency. The output of circuit 11 for each of the other frequencies is compared in the computer system with the output of the circuit at the reference frequency to determine the amplitude versus frequency characteristics of circuit 11.

To these ends, microprocessor 19 controls the ROM 16 to activate switches 26 and 27 so that the output of oscillator 22 is coupled to the input of circuit 11 and the output of circuit 11 is coupled to the input of RMS-to-DC converter 24. With these connections established, ROM 16 controls oscillator 22 so that the frequency of the oscillator is stepped through a gamut of frequencies corresponding to the range of frequencies for which circuit 11 is to be tested; in one preferred embodiment, the frequencies are at the decades from 10 Hz to 1 MHz, i.e., 10 Hz, 100 Hz, 1 KHz, 10 KHz, 100 KHz and 1 MHz. The values of resistors 13 and 14 are controlled by ROM 16 so that resistors 13 and 14 are not varied as the frequency of oscillator 22 is varied. The resulting sequency of AC voltages derived by circuit 11 is coupled to converter 24, which derives DC voltages accurately representing the values of the RMS values of the AC output of circuit 11. The DC outputs of converter 24 are converted into digital signals by converter 23 and stored in designated addresses in RAM 17 under the control of address signals from ROM 16.

The stored amplitude values for the outputs of amplifier 11 at each of the different frequencies of oscillator 22 are normalized in microprocessor 19 against the output of circuit 11 for the reference frequency. The normalized values are stored at addresses in RAM 17 at locations corresponding to each frequency position of oscillator 22. Each normalized value for each decade frequency position of oscillator 22 is combined with the calibration error for the output of circuit 11 for each of the different combinations and permutations for the values of resistors 13 and 14 to derive a calibration error for each amplitude range of the input to circuit 11 if the circuit is used in a meter or for each output amplitude of circuit 11 if the circuit is used in a calibrator. When circuit 11, as part of meter or a calibrator, is responsive to frequencies between the set frequencies at the decade intervals of 10 Hz, 100 Hz, 1 KHz, 10 KHz, 100 KHz and 1 MHz, the meter calibrator may include a program for interpolating calibration errors between the calibrated frequencies.

Figure 2:
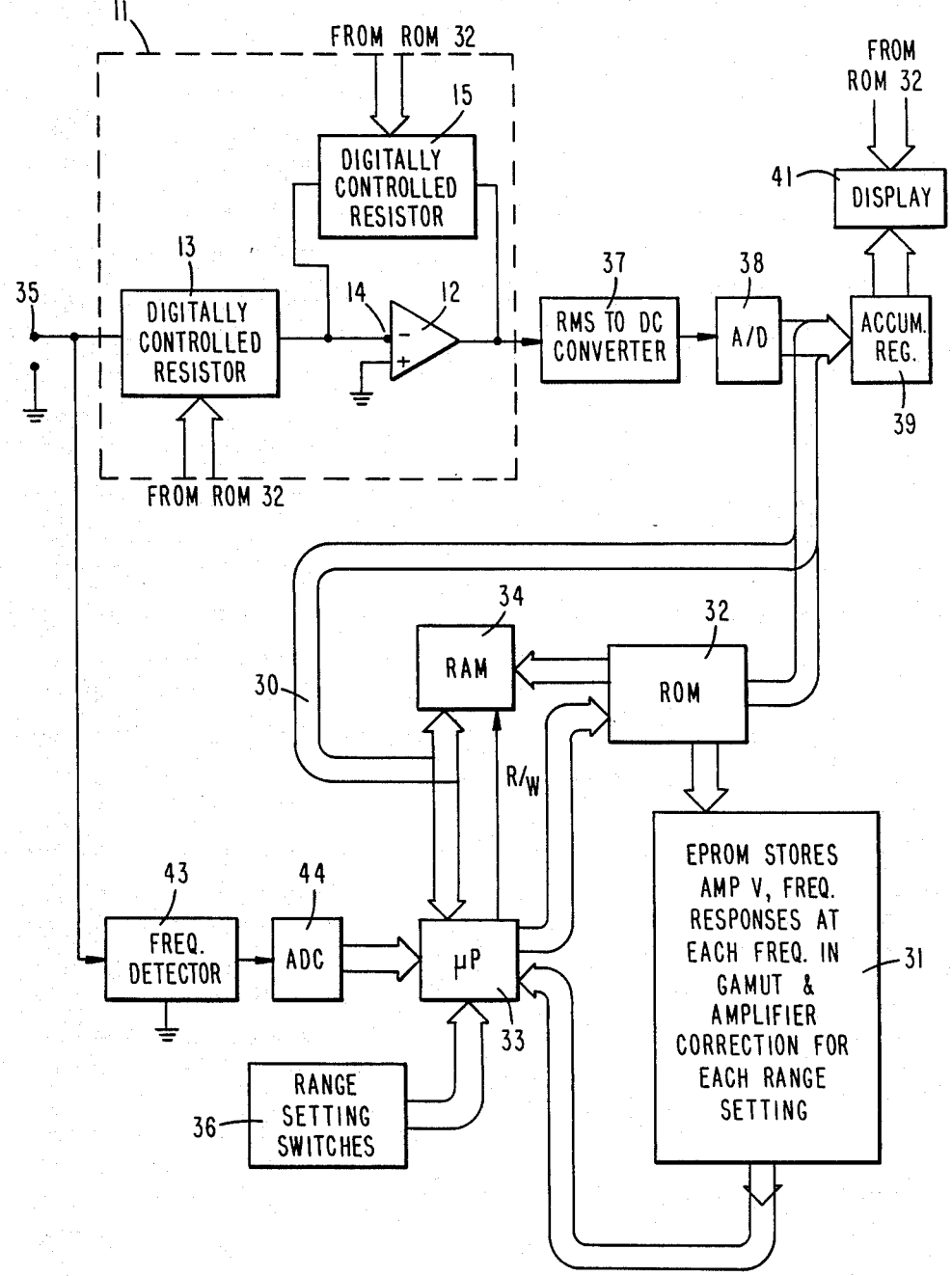
FIG. 2 is a block diagram of a digital meter for measuring an AC voltage and for correcting the output of an amplifier included in the meter as a function of a range setting of the amplifier and the frequency applied to the amplifier.

Reference is now made to FIG. 2 of the drawing, a block diagram of apparatus in which circuit 11 is used in a digital voltmeter responsive to a variable amplitude, variable frequency AC source. The amplitude range of the source being monitored is from 200 millivolts full-scale to 1,100 volts full-scale; the frequency of the source can be from 10 Hz to 1 MHz.

The meter of FIG. 2 includes amplifier circuit 11 which has been previously tested to determine the calibration errors thereof as a function of amplitude and frequency, as described in connection with FIG. 1. The calibration errors are stored in electronically programmble read-only memory (EPROM) 31 which is addressed by an output of read-only memory (ROM) 32, in turn responsive to address signals from microprocessor 33. Microprocessor 33 is responsive to data signals read out of EPROM 31, as well as data signals from RAM 34, which stores signals indicative of the amplitude and frequency of a monitored signal applied to meter input terminals 35. Microprocessor 33 is responsive to signals derived by an operator closing range setting switches 36. The signals from switches 36 control microprocessor 33 and the values of resistors 13 and 15 by way of read-only memory 32 to set the amplification factor of circuit 11. Microprocessor 33 responds to the signals from range setting switches 36 to address designated locations in EPROM 31 commensurate with the calibration error of circuit 11 associated with the range selected by the operator closing switches 36.

The amplitude of the AC output of circuit 11 is monitored by coupling the output of amplifier 12 to RMS-to-DC converter 37, preferably of the thermal type as discussed supra. The analog output of converter 37 is applied to analog-to-digital converter 38 which derives a multi-bit digital signal having a value commensurate with the value of the output of converter 37. The multbit output signal of converter 38 is supplied to accumulator register 39, where it is incremented or decremented by a value commensurate with the calibration error of circuit 11 for the settings of resistors 13 and 15 and the frequency applied to input terminal 35. The calibration error signal is derived from RAM 34 in response to an address signal fromrom 32. The signal stored in accumulator register 39 resulting from the output of converter 38 being incremented or decremented by the output of RAM 34 is supplied to digital display 41. The magnitude on display 41 represents the RMS amplitude of the AC signal at terminal 35 with correction for the gain factor of amplifier 12 being provided.

To determine the frequency of the AC signal applied to terminals 35, the meter of FIG. 2 is provided with frequency detector 43, having an input connected to input terminal 35. Because of the wide frequency range of the signal at terminals 35, frequency detector 43 may include multiple parallel bandpass filters, one for each frequency decade. Each of the bandpass filters in detector 43 has a center frequency equal to the frequency associated with that decade, so that, for example, detector 43 includes bandpass filters with center frequencies at 10 Hz, 100 Hz, 1 KHz, 10 KHz, 100 KHz and 1 MHz. Each filter has a pass band of approximately one decade; for example, the bandpass filter having a center frequency of 100 Hz has a pass band from 50 Hz to 500 Hz. Detector 43 includes six amplitude detectors, each responsive to the output of an associated bandpass filter. The output signals of the amplitude detectors are compared in an analog comparator; the amplitude detector deriving the largest voltage represents the frequency decade of the signal applied to terminals 35. Hence, frequency detector 43 includes plural output leads, one associated with each decade. A binary signal is derived on only one of the leads to indicate the frequency decade where the signal supplied to terminal 35 dwells. Hence, frequency detector 43 derives a one out of n signal, where n is the number of decades of the signal which is susceptible to being coupled to terminals 35. In the specific example of a signal ranging from 10 Hz to 1 MHz, the value of n is 6.

The one out of n output signal of frequency detector 43 is supplied to a one out of n to binary converter which supplies microprocessor 33 with a binary signal indicative of the frequency decade for the signal applied to terminal 35. The frequency decade indicating signal is supplied by microprocessor 33 to a designated address in RAM 34 where it is stored to read out, under the control of ROM 32, an address in EPROM 31 where the frequency calibration error for the detected decade is located. The stored response in EPROM 31 for the calibration error for circuit 11 for the decade of the frequency supplied by terminal 35 to circuit 11 is combined in microprocessor 33 with a calibration error signal for the amplitude of the output of circuit 11 for the values of resistors 13 and 15. The amplitude calibration error signals are supplied to microprocessor 33 by EPROM 31 under the control of signals from ROM 32.

If the meter includes a precise frequency indicator, the output of each of the bandpass filters in detector 43 is coupled to a separate frequency detector. Each separate frequency detector derives a DC signal having a value monotomically related to the frequency of the signal in the bandpass of the filter. The DC, frequency indicating signal derived from the bandpass filter having the highest AC output amplitude, as determined by the analog comparator, is coupled to the input of analog-to-digital converter 44 which derives a multi-bit, digital output signal that is supplied to microprocessor 33. Microprocessor 33 responds to the precise frequency indicating output signal of DAC 44 and, under the control of ROM 32, supplies the precise frequency indicating digital signal to a designated address in RAM 34. The precise frequency indicating signal in RAM 34 is supplied to a suitable display (not shown) to indicare the precise value of the frequency applied to terminals 35. The decimal point position of the display is controlled by a detected decade representing signal derived in response to the one out of n signal and stored in RAM 34.

The precise frequency indicating signal stored in RAM 34 is used in conjunction with an interpolation program stored in ROM 32 to determine the precise calibration error for circuit 11 for the exact frequency applied to terminals 35. ROM 32 addresses EPROM 31 to supply RAM 34 with the calibration errors of circuit 11 for the two decade values immediately adjacent the frequency determined by detector 43 for the signal at terminals 35. These two calibration errors are combined in microprocessor 33 with the precise frequency indicating signal in the decade. Microprocessor 33 executes a conventional interpolation sub-routine to derive the calibration error for circuit 11 for the particular frequency applied by terminals 35 to circuit 11. The calibration error for the detected frequency is modified by the calibration error of circuit 11 for the values of resistors 13 and 15 which were set by ROM 32 in response to activation of range setting switches 36.

The calibration errors determined for circuit 11 can also be used in a calibrator that derives an AC calibrating voltage over a wide amplitude and frequency range. Such a calibrating voltage would, from time to time, be coupled to input terminals 35 of the meter of FIG. 2 to determine the accuracy of the meter. Inaccuracies in the reading of the meter from display 41 are corrected by changing the values in EPROM 31 utilizing conventional techniques.

A calibrator including the present invention for supplying AC calibrating voltages to an external meter being calibrated is illustrated in the circuit diagram of FIG. 3. The external calibrated meter responds to the calibrator AC output voltage having a wide frequency range, between 10 Hz and 1 MHz in one embodiment, and a wide range of amplitudes, as derived from amplifier 162, in turn responsive to the output of variable frequency, fixed amplitude oscillator 103. The frequency of oscillator 103 is controlled in response to an operator of the calibrator closing switches in switch bank 118, coupled to microprocessor 111. The frequency indicating signals from bank 118 are supplied via microprocessor 111 to RAM 117, thence to a buffer in oscillator 103 under the control of address signals from ROM 113.

The variable frequency output of oscillator 103 is changed in amplitude by the circuit including amplifier 162 and the impedances associated therewith, namely digitally controlled resistors 161 and 163, as well as voltage controlled resistor 158. Resistors 158 and 163 respectively correspond generally with resistors 13 and 15, FIG. 1. Resistors 158 and 161 are connected in series with each other between the output of oscillator 103 and the input of amplifier 162, while resistor 163 is connected in a feedback path between the input and output terminals of amplifier 162. The values of resistors 161 and 163 are controlled in response to the output of ROM 113 to control the range of the output of amplifier 162 and the amplitude of the output in the range to predetermined, nominal values. The outputs of ROM 113 for controlling the values of resistors 161 and 163 are in turn controlled by signals from amplitude control switch bank 119, responsive to operator controls for the desired amplitude supplied by the calibrator, at the output of amplifier 162, to the meter being calibrated. The signals from switch bank 118 are coupled through microprocessor 111 to designated addresses in RAM 117, thence to address inputs of ROM 113 under the control of the program stored in ROM 113.

Resistor 158 responds to calibration correction signals, as coupled to DAC 134 by RAM 117 for the AC output in each amplitude and frequency range. RAM 117 is addressed by outputs of ROM 113 designated for the calibration errors for the settings of resistors 161 and 163 and the frequency of oscillator 103. The magnitudes of the calibration errors supplied by RAM 117 to DAC 134, which are in a manner described supra in connection with FIG. 1. If oscillator 103 is set to derive a frequency between the frequencies for which it has been calibrated, the calibration errors for the two adjacent calibrated frequencies are supplied by RAM 117 to microprocessor 111. Microprocessor 111 interpolates between the calibration errors for the two adjacent frequencies to determine the calibration error for the set frequency. The calibration error for the set frequency is coupled to RAM 117 for control of resistor 158 via DAC 134.

RAM 117 also supplied digital control signals to resistor 158 to provide a precise, relatively long term feedback control for the output of amplifier 162; in the preferred embodiment, the feedback loop including RAM 117 and resistor 158 maintains the output of amplifier 162 to 10 parts per million. A coarse (0.1%), real time feedback path is also provided to voltage controlled resistor 158 via RMS to DC converter 10A. Hence, two basically parallel feedback loops are provided, one being a relatively coarse, real time loop and the second being a precise, relatively long time constant loop.

The output voltage of amplifier 162 has a tendency to decrease as the frequency of oscillator 103 increases because of distributed, i.e., stray, capacitances of the control circuit. The long time constant, precise loop includes compensation for the reduced output voltage of amplifier 162 as the frequency of oscillator 103 is increased. The effect of the distributed capacitances and the amount of required compensation is determined during the calibration procedure and stored in RAM 117 to control the value of resistor 158 while the output of amplifier 162 is being coupled as a calibrating voltage to an external meter. Thereby as the frequency of oscillator 103 changes, the value of resistor 158 is accordingly changed so the AC output of amplifier 162 supplied to the external meter is maintained at the desired value.

The real time, coarse feedback loop includes RMS-AC to DC converter 104, while the relatively long time constant, precise control feedback loop includes RMS-AC to DC converter 105. Converters 104 and 105 are driven in parallel by the output of attenuator 167, including amplifier 165 having an input terminal connected to the output of amplifier 162 by digitally controlled resistor 164; fixed resistor 166 is connected as a feedback impedance between the input and output terminals of amplifier 165. The value of resistor 164 is controlled by the output of ROM 103 in a manner similar to the control provided by the ROM for resistor 163. Thereby, the attenuation factor of amplifier 165 and the gain factor of amplifier 162 are approximately the same, so that the output of amplifier 165 stays in a range which can be handled by converters 104 and 105 regardless of the amplitude of the voltage applied by amplifier 162 to the external device being calibrated.

The AC output of amplifier 165 is applied to RMS to DC converter 104 which derives a DC output signal having a magnitude indicative of the actual RMS output of amplifier 165. For each of the settings of digitally controlled resistors 161, 163 and 164 and for each of the frequencies of oscillator 103, converter 104 should derive a predetermined DC output voltage. The output voltage of converter 104 is compared with a preset value for the output thereof stored in a designated address in ROM 113. The value stored in the designated address of ROM 113 is determined by the frequency of oscillator 103, as well as the values of resistors 161, 163 and 164. The signal in ROM 113 at the address is supplied to DAC 134 where it is modified by the calibration error supplied to the DAC by RAM 117. The DC output signals of DAC 134 and converter 104 are respectively applied to the non-inverting and inverting input terminals of integrator 237 which derives an analog error signal having a magnitude and polarity that controls the value of voltage controlled resistor 158 to maintain, on a real time basis, the output voltage of amplifier 162 at approximately the desired level indicated by the output of DAC 134. To prevent ripple in the output of integrator 237, the integrator output is applied to low pass filter 238, thence to a control input terminal 159 of resistor 158.

The precise, long time constant control of the output of amplifier 162 is provided by supplying the output of RMS to DC converter 105 to the input of analog-to-digital converter 133. Converter 133 thereby derives a multi-bit digital signal which is coupled to a designated address in RAM 117 under the control of an address output signal of ROM 113. The signal in RAM 117 representing the magnitude of the output of converter 105 is compared in microprocessor 111 with a digital signal stored in ROM 113 indicative of a desired preset value for the output of converter 105 for the range designated by the values of resistors 163 and 164 and the value within the range, as indicated by the value of resistor 161. Microprocessor 111 responds to the digital signals representing the preset and actual values for the output of converter 105 to derive a digital error signal that is coupled back to a designated address in RAM 117, under the control of ROM 113.

The error representing digital signal for the output of converter 105 stored in RAM 117 is periodically read out of the RAM into an accumulator register in resistor 158 to increment and decrement the value of resistor 158. The value stored in the accumulator register in resistor 158 indicates he amplitude of the AC output of amplifier 162 within the range designated by the values of resistors 163 and 164, as supplied to the register by ROM 113.

While there have been described and illustrated several specific embodiments of the invention, it will be clear that variations in the details of the embodiments specifically illustrated and described may be made without departing from the true spirit and scope of the invention as defined in the appended claims.

I claim:

1. A method of determining the magnitude of errors introduced as a function of frequency by a circuit used in a device to derive a calibration AC output signal or a device for measuring the amplitude of an AC signal with a precise sensor for deriving a DC output having an amplitude commensurate with the amplitude of an AC input thereof, the precise sensor having a known input signal-output calibrating error, comprising the steps of applying different known DC levels to an input of the circuit while the sensor is connected to be responsive to an output of the circuit, controlling the values of the DC levels and of variable elements in the circuit so the circuits supplied the sensor with a first gamut of DC signals, the DC signals in the first gamut resulting in the sensor deriving DC in a second gamut of DC signals, the known DC levels and the values of the variable elements being arranged so each signal in the second gamut is supposed to have a predetermined value, comparing actual values of the signals in the second gamut with the value each signal in the second gamut is supposed to have to derive a numerical indication of the DC calibration error for each of the values of the DC levels and of the variable elements, applying a constant amplitude AC voltage to the input of the circuit at plural frequencies in a gamut of frequencies while the sensor is connected to be responsive to the output of the circuit, the AC voltage and DC levels being applied to the input of the circuit at mutually exclusive times, one of said frequencies being a frequency at which reactive components in the circuit have negligible effect on the amplitude of the output of the circuit, comparing the amplitude of the output of the sensor for frequencies in the gamut with the output of the sensor at said one frequency to derive a numerical indication of the AC calibration error for said constant amplitude at said frequencies in said gamut of frequencies, and combining the calibration error of the precise sensor with the DC calibration errors and the AC calibration errors to derive a calibration error of the circuit for each of several amplitude positions at each of several frequency positions.

2. A method of determining the magnitude of errors introduced as a function of frequency by a circuit used in a device to derive a calibration AC output signal or a device for measuring the amplitude of an AC signal with a precise sensor for deriving a DC output having an amplitude commensurate with the amplitude of an AC input thereof, the precise sensor having a known input signal-output signal calibrating error, comprising the steps of applying an AC voltage to the input of the circuit at each frequency in a gamut of frequencies while the sensor is connected to be responsive to the output of the circuit, one of said frequencies being a frequency at which reactive components in the circuit have negligible effect on the amplitude of the output of the circuit, comparing the amplitude of the output of the sensor for frequencies in the gamut with the output of the sensor at said one frequency to derive a numerical indication of the AC calibration error at said frequencies in said gamut of frequencies, deriving an amplitude calibration error for the circuit at several amplitude positions in a gamut of input amplitudes for the circuit, and combining the calibration error of the precise sensor with the amplitude calibration errors and the AC calibration errors to derive a calibration error of the circuit for each of several amplitude positions at each of several frequency positions. circuit calibration errors enabling the AC output to be 3. A method of determining calibrating errors of a variable gain amplifier for a gamut of frequencies, the gain of the variable gain amplifier being varied by adjusting the value of a variable resistor of the amplifier in discrete steps, the amplifier being used in an AC calibrator or a meter for measuring AC, the method comprising the steps of applying a variable amplitude signal to be amplifier while adjusting the resistor to the discrete step values so the amplifier derives a gamut of variable amplitude signals that are supposed to have predetermined values, detecting the amplitudes of the gamut of variable amplitude signals derived by the amplifier, comparing the detected amplitudes with the values that the signals are supposed to have to derive a calibrating error signal of the amplifier for discrete step values of the variable resistor, applying a gamut of variable frequency signals to the amplifier while maintaining the gain of the amplifier constant, the amplitude of each frequency in the gamut of variable frequency signals being the same, the amplifier having a tendency to derive an AC output signal having a different amplitude in response to different frequencies in the gamut of variable frequency signals, detecting the amplitude of the amplifier output for each frequency in the gamut of frequencies applied to the amplifier, comparing the amplitude of the output signal of the amplifier while frequencies in the gamut of frequencies are applied to the amplifier with the amplitude of the amplifier output for one frequency in the gamut to derive an indication of the amplitude versus frequency response of the amplifier, and modifying the indication of the amplitude versus frequency response of the amplifier by the derived calibrating error signal of the amplifier.

4. Apparatus for determining the magnitude of errors introduced as a function of frequency by a circuit used in a device to derive a calibration AC output signal or a device for measuring the amplitude of an AC signal comprising a precise sensor for deriving a DC output having an amplitude commensurate with the amplitude of an AC input thereof, the precise sensor having a known input signal-output signal calibrating error, means for applying different known DC levels to an input of the circuit while the sensor is connected to be responsive to an output of the circuit, means for controlling the values of the DC levels and of variable elements in the circuit so the circuit supplies the sensor with a first gamut of DC signals, each DC signal in the first gamut resulting in the sensor deriving a DC signal in a second gamut of DC signals, the known DC levels and the values of the variable elements being arranged so each signal in the second gamut is supposed to have a predetermined value, means for comparing actual values of the signals in the second gamut with a signal representing the value each signal in the second gamut is supposed to have to derive a numerical indication of the DC calibration error for each of the values of the DC levels and of the variable elements, means for applying a constant amplitude AC source to the input of the circuit at each frequency in a gamut of frequencies while the sensor is connected to be responsive to the output of the circuit, the AC voltage and DC levels being applied to the input of the circuit at mutually exclusive times, one of said frequencies being a frequency at which reactive components in the circuit have negligible effect on the amplitude of the output of the circuit, means for comparing the amplitude of the output of the sensor for all of said frequencies in the gamut with the output of the sensor at said one frequency to derive a numerical indication of the AC calibration error for said constant amplitude at each of said frequencies in said gamut of frequencies, and means for combining the calibration error of the precise sensor with the DC calibration errors and the AC calibration errors to derive a calibration error of the circuit for each of several amplitude positions at each of several frequency positions.

5. Apparatus for determining the magnitude of errors introduced as a function of frequency by a circuit used in a device to derive a calibration AC output signal or a device for measuring the amplitude of an AC signal comprising a precise sensor for deriving a DC output having an amplitude commensurate with the amplitude of an AC input thereof, the precise sensor having a known input signal-output signal calibrating error, an AC source selectively connected to the input of the circuit for supplying frequencies in a gamut of frequencies to the circuit while the sensor is connected to be responsive to the output of the circuit, one of said frequencies being a frequency at which reactive components in the circuit have negligible effect on the amplitude of the output of the circuit means for comparing the amplitude of the output of the sensor for frequencies in the gamut with the output of the sensor at said one frequency to derive a numerical indication of the amplitude versus frequency response of said circuit at said frequencies in said gamut of frequencies and for deriving an amplitude calibration error for the circuit at each of several amplitude positions in a gamut of amplitudes for the circuit, and means for combining the calibration error of the precise sensor with the amplitude calibration errors and the amplitude versus frequency response to derive a calibration error of the circuit for each of several amplitude positions at each of several frequency positions.

6. Apparatus for determining calibrating errors of a variable gain amplifier for a gamut of frequencies, the gain of the variable gain amplifier being varied by adjusting the value of a variable resistor of the amplifier in discrete steps, the amplifier being used in an AC calibrator or a meter for measuring AC, the apparatus comprising a variable amplitude voltage source, means for selectively applying the voltage of the variable amplitude voltage source to the amplifier while adjusting the resistor to the discrete step values so the amplifier derives a gamut of variable amplitude signals that are supposed to have predetermined values, means for selectively applying a gamut of variable frequency signals to the amplifier, the amplitude of the signal at each frequency in the gamut of variable frequency signals being the same, the amplifier having a tendency to derive an AC output signal having a different amplitude in response to different frequencies in the gamut of variable frequency signals, means for detecting the amplitudes of the gamut of variable amplitude signals derived by the amplifier and for detecting the amplitude of the amplifier output for frequencies in the gamut of frequencies applied to the amplifier, means for comparing the detected amplitudes of the gamut of variable amplitude signals derived by the amplifier with the values that the signals are supposed to have to derive a calibrating error signal of the amplifier for discrete step values of the variable resistor and for comparing the amplitude of the output signal of the amplifier while each frequency in the gamut of frequencies is applied to the amplifier with the amplitude of the amplifier output for one frequency in the gamut to derive an indication of the amplitude versus frequency response of the amplifier, and for modifying the indication of the amplitude versus frequency response of the amplifier by the derived calibrating error signal of the amplifier.

* * * * *